(12) United States Patent
Haylock et al.

(10) Patent No.: US 9,128,118 B2
(45) Date of Patent: Sep. 8, 2015

(54) TESTING SYSTEMS WITH AUTOMATED LOADING EQUIPMENT AND POSITIONERS

(75) Inventors: Jonathan M. Haylock, Los Angeles, CA (US); Robert J. Hill, Salinas, CA (US); Peter G. Panagas, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 364 days.

(21) Appl. No.: 13/590,963

(22) Filed: Aug. 21, 2012

(65) Prior Publication Data

US 2014/0055147 A1    Feb. 27, 2014

(51) Int. Cl.
| | |
|---|---|
| *G01R 27/02* | (2006.01) |
| *G01R 1/04* | (2006.01) |
| *G01R 31/01* | (2006.01) |
| *H04M 1/24* | (2006.01) |
| *H05K 9/00* | (2006.01) |
| *G01R 29/08* | (2006.01) |

(52) U.S. Cl.
CPC  *G01R 1/04* (2013.01); *G01R 31/01* (2013.01); *H04M 1/24* (2013.01); *H05K 9/0069* (2013.01); *G01R 29/0821* (2013.01)

(58) Field of Classification Search
CPC . G01R 27/02; G01R 27/2635; G01R 27/2682
USPC ......... 324/602, 750.13–750.19, 750.3–754.3, 324/754.08–754.11, 756.02–756.07
See application file for complete search history.

(56) References Cited

U.S. PATENT DOCUMENTS

| | | | |
|---|---|---|---|
| 4,901,080 A * | 2/1990 | McHenry | 342/1 |
| 7,035,594 B2 | 4/2006 | Wallace et al. | |
| 7,688,094 B2 | 3/2010 | Osato | |
| 2008/0058829 A1 * | 3/2008 | Buscher et al. | 606/96 |
| 2010/0271267 A1 | 10/2010 | Roth et al. | |
| 2011/0156734 A1 * | 6/2011 | Berry et al. | 324/750.19 |

FOREIGN PATENT DOCUMENTS

WO    2011073987    6/2011

* cited by examiner

*Primary Examiner* — Melissa Koval
*Assistant Examiner* — Trung Nguyen
(74) *Attorney, Agent, or Firm* — Treyz Law Group; Kendall P. Woodruff

(57) ABSTRACT

A test system may be provided in which devices under test are tested using radio-frequency test stations. A test station may include a test host, a test unit coupled to the test host, and a shielded enclosure. The shielded enclosure may contain a test antenna coupled to the test unit via a radio-frequency cable. A computer-controlled loading arm may be used to place a device under test on a positioner within the test enclosure. The test enclosure may have an enclosure door that is opened and closed using a computer-controlled pneumatic cylinder. When the enclosure door is closed, a portion of the enclosure door may actuate one or more levers on the positioner, which may in turn actuate one or more positioning arms to press the device under test against one or more guide surfaces on the positioner, thereby precisely positioning the device under test within the test enclosure.

19 Claims, 11 Drawing Sheets

TESTING SYSTEMS WITH AUTOMATED LOADING EQUIPMENT AND POSITIONERS

BACKGROUND

This relates generally to testing systems, and, more particularly, to testing systems that use automated loading equipment and positioning structures.

Electronic devices are often tested following assembly to ensure that device performance meets design specifications. For example, a device may be tested at a series of test stations to ensure that components and software in the device are operating satisfactorily. At each test station, a test system operator may place a device under test into a test enclosure. The position and orientation of a device under test within a test enclosure needs to be precise in order to ensure that test results are accurate. Following testing at a given test station, the test system operator may remove the device under test from the test enclosure. Following successful testing at all test stations, a device may be shipped to an end user.

The process of loading and unloading devices under test from test enclosures can be cumbersome and burdensome to test system operators. If care is not taken, a device under test may be improperly positioned within a test enclosure, which may in turn lead to inaccurate or skewed test results. Additionally, excessive contact between a test system operator and a device under test may increase the risk of cosmetic damage to the device under test.

It would therefore be desirable to be able to provide improved ways of performing manufacturing operations such as testing operations on electronic devices.

SUMMARY

A test system may be provided in which radio-frequency test stations are used to perform wireless testing on devices under test. Test apparatus may include a test host, a test unit, and an electromagnetically shielded test enclosure (e.g., a shielded test box such as a transverse electromagnetic cell or other suitable type of test box or test chamber).

The test system may include a computer-controlled loading arm configured to convey devices under test between test input locations, test output locations, and test enclosures. The computer-controlled loading arm may have pneumatic ports that may be used to temporarily adhere a device under test to the computer-controlled loading arm. The computer-controlled loading arm may be used to load devices under test into test enclosures.

A dielectric support structure may be mounted in each test enclosure and may be configured to receive a device under test. The dielectric support structure may function as a positioner in which one or more positioning arms are used to press the device under test against one or more guide surfaces. For example, a first positioning arm may press the device under test against a first guide surface, while a second positioning arm may press the device under test against a second guide surface, thereby precisely positioning the device under test in a predetermined location.

The positioner may have one or more levers that may be used to control the movement of the positioning arms. The levers may be actuated by closing the test enclosure door. For example, a door to the test enclosure may have portions that actuate the levers on the positioner when the door is closed. With this type of configuration, closing the test enclosure may automatically actuate the positioner to position the device under test in a precise location within the test enclosure.

The test enclosure door may be opened and closed using a computer-controlled door actuator. The computer-controlled door actuator may include, for example, a pneumatic cylinder.

When the device under test is properly positioned, the test unit may perform testing on the device under test. This may include, for example, using a test antenna coupled to the test enclosure to convey radio-frequency test signals between the test unit and the device under test.

Further features of the invention, its nature and various advantages will be more apparent from the accompanying drawings and the following detailed description of the preferred embodiments.

DETAILED DESCRIPTION

Electronic devices may be manufactured using automated manufacturing equipment. The automated manufacturing equipment may include equipment for assembling device components together to form an electronic device. The automated manufacturing equipment may also include testing systems for evaluating whether devices have been properly assembled and are functioning properly.

Electronic devices may be provided with wireless communications circuitry. The wireless communications circuitry may be used to support wireless communications in multiple wireless communications bands. The wireless communications circuitry may include multiple transmit and receive antennas arranged to implement an antenna diversity system.

The antennas can include loop antennas, inverted-F antennas, strip antennas, planar inverted-F antennas, slot antennas, hybrid antennas that include antenna structures of more than one type, or other suitable antennas. Conductive structures for the antennas may be formed from conductive electronic device structures such as conductive housing structures (e.g., a ground plane and part of a peripheral conductive housing member or other housing structures), traces on substrates such as traces on plastic, glass, or ceramic substrates, traces on flexible printed circuit boards ("flex circuits"), traces on rigid printed circuit boards (e.g., fiberglass-filled epoxy boards), sections of patterned metal foil, wires, strips of conductor, other conductive structures, or conductive structures that are formed from a combination of these structures.

Figure 1:
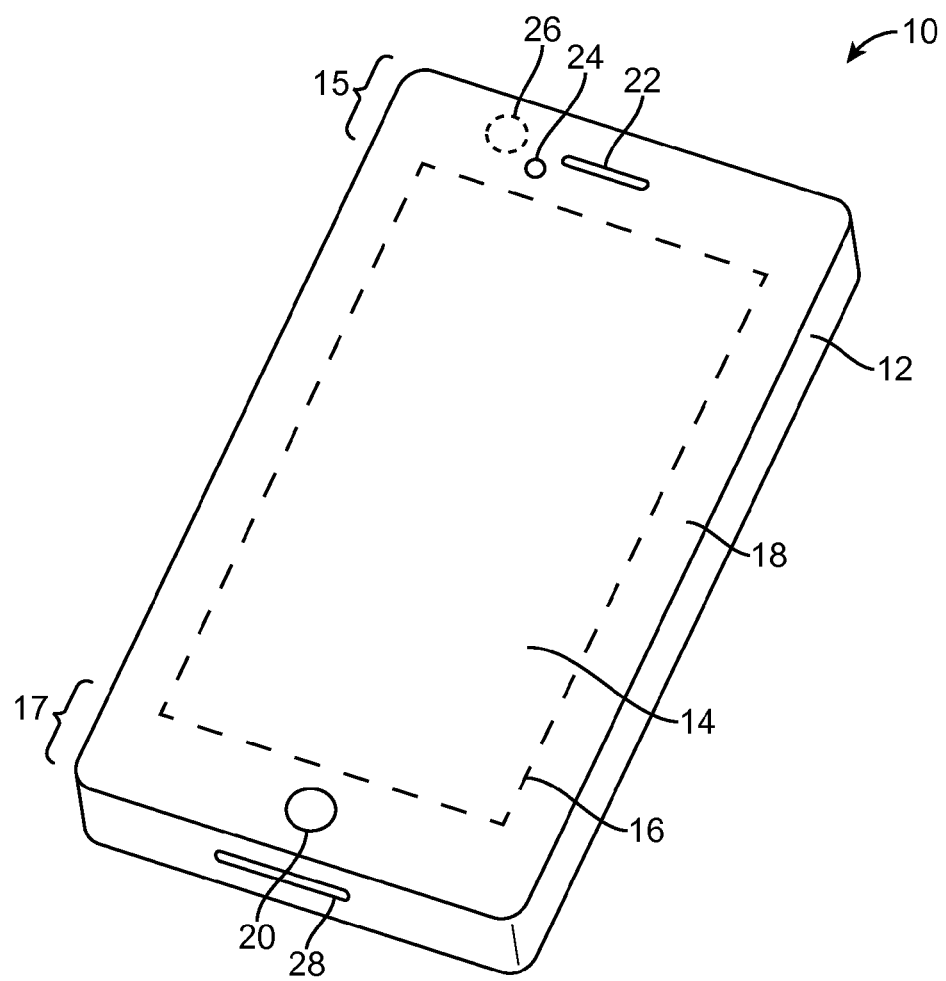
FIG. 1 is a perspective view of an illustrative electronic device such as a handheld device of the type that may be manufactured using automated equipment in accordance with an embodiment of the present invention.

Wireless communications circuitry in an electronic device may be tested using automated equipment. An illustrative electronic device of the type that may be manufactured and tested using automated equipment is shown in FIG. 1. Electronic device 10 of FIG. 1 may be a computer monitor with an integrated computer, a desktop computer, a television, a notebook computer, other portable electronic equipment such as a cellular telephone, a tablet computer, a media player, a wristwatch device, a pendant device, an earpiece device, other compact portable devices, or other electronic equipment. In the configuration shown in FIG. 1, device 10 is a handheld electronic device such as a cellular telephone, media player, navigation system device, or gaming device.

As shown in FIG. 1, device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may, if desired, have a display such as display 14. Display 14 may be a touch screen that incorporates capacitive touch electrodes or may be insensitive to touch. Display 14 may include image pixels formed from light-emitting diodes (LEDs), organic LEDs (OLEDs), plasma cells, electrophoretic display elements, electrowetting display elements, liquid crystal display (LCD) components, or other suitable image pixel structures. A cover glass layer may cover the surface of display 14. Openings for buttons such as button 20, openings for speaker ports such as speaker port 22, and other openings may be formed in the cover layer of display 14, if desired.

The central portion of display 14 (e.g., active region 16) may include active image pixel structures. The surrounding rectangular ring-shaped inactive region (region 18) may be devoid of active image pixel structures. If desired, the width of inactive region 18 may be minimized (e.g., to produce a borderless display).

Device 10 may include components such as front-facing camera 24. Camera 24 may be oriented to acquire images of a user during operation of device 10. Device 10 may include sensors in portion 26 of inactive region 18. These sensors may include, for example, an infrared-light-based proximity sensor that includes an infrared-light emitter and a corresponding light detector to emit and detect reflected light from nearby objects. The sensors in portion 26 may also include an ambient light sensor for detecting the amount of light that is in the ambient environment for device 10. Other types of sensors may be used in device 10 if desired. The example of FIG. 1 is merely illustrative.

Device 10 may include input-output ports such as port 28. Ports such as port 28 may include audio input-output ports, analog input-output ports, digital data input-output ports, or other ports. Each port may have an associated connector. For example, an audio port may have an associated four-contact audio connector, a digital data port may have a connector with two or more pins (contacts), a connector with four or more pins, a connector with thirty pins, or other suitable data port connector.

Sensors such as the sensors associated with region 26 of FIG. 1, cameras such as camera 24, audio ports such as speaker port 22, buttons such as button 20, and ports such as port 28 may be located on any suitable portion of device housing 12 (e.g., a front housing face such as a display cover glass portion, a rear housing face such as a rear planar housing wall, sidewall structures, etc.).

Housing 12 may include a peripheral conductive member such as a bezel or band of metal that runs around the rectangular outline of display 14 and device 10 (as an example). The peripheral conductive member may be used in forming the antennas of device 10 if desired.

Antennas may be located along the edges of device 10, on the rear or front of device 10, as extending elements or attachable structures, or elsewhere in device 10. With one suitable arrangement, which is sometimes described herein as an example, device 10 may be provided with one or more antennas at lower end 17 of housing 12 and one or more antennas at upper end 15 of housing 12. Locating antennas at opposing ends of device 10 may allow these antennas to be formed at an appropriate distance from ground structures that are associated with the conductive portions of display (e.g., the pixel array and driver circuits in active region 16 of display 14).

If desired, a first cellular telephone antenna may be located in region 17 and a second cellular telephone antenna may be located in region 15. Antenna structures for handling satellite navigation signals such as Global Positioning System signals or wireless local area network signals such as IEEE 802.11 (WiFi®) signals or Bluetooth® signals may also be provided in regions 15 and/or 17 (either as separate additional antennas or as parts of the first and second cellular telephone antennas). Antenna structures may also be provided in regions 15 and/or 17 to handle WiMax (IEEE 802.16) signals.

In regions 15 and 17, openings may be formed between conductive housing structures and printed circuit boards and other conductive electrical components that make up device 10. These openings may be filled with air, plastic, or other dielectrics. Conductive housing structures and other conductive structures may serve as a ground plane for the antennas in device 10. The openings in regions 15 and 17 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element such as an inverted-F antenna resonating element formed from part of a conductive peripheral housing structure in device 10 from the ground plane, or may otherwise serve as part of antenna structures formed in regions 15 and 17.

Antennas formed in regions 15 and 17 may be identical (i.e., antennas formed in regions 15 and 17 may each cover the same set of cellular telephone bands or other communications bands of interest). Due to layout constraints or other design constraints, it may not be desirable to use identical antennas. Rather, it may be desirable to implement the antennas in regions 15 and 17 using different designs. For example, a first antenna in region 17 may cover all cellular telephone bands of interest (e.g., four or five bands) and a second antenna in region 15 may cover a subset of the four or five bands handled by the first antenna. Arrangements in which the antenna in region 17 handles a subset of the bands handled by the antenna in region 15 may also be used. Tuning circuitry may be used to tune this type of antenna in real time to cover either a first subset of bands or a second subset of bands and thereby cover all bands of interest.

To reliably receive incoming voice or data calls, device 10 should be able to receive incoming paging signals. In some situations, incoming paging signals are weak due to interference or a relatively large distance between device 10 and the transmitting cellular telephone tower. In situations such as these, multiple antennas (e.g., both antennas in a dual antenna system) may be used in receiving paging signals. Combining received signals from multiple antennas can improve received signal quality and can therefore help ensure that incoming pages are received properly, even in areas with weak signals. Use of dual antennas in receiving signals generally consumes more power than use of a single antenna in receiving signals. Device 10 may therefore revert to using only a single antenna whenever signal conditions improve.

An antenna switching algorithm that runs on the circuitry of device 10 can be used to automatically change between antenna modes in real time based on the evaluated signal quality of received signals. The antenna switching algorithm may direct device 10 to operate in a multiple antenna mode (e.g., a dual antenna mode) when incoming signals are weak and may direct device 10 to operate in a single antenna mode when incoming signals are strong (as an example). With this type of arrangement, it is not necessary to simultaneously use multiple antennas and associated receiver circuits for monitoring incoming paging signals except when paging signals are of poor quality, thereby minimizing power consumption.

Arrangements in which device 10 has a primary antenna (e.g., an antenna that typically exhibits superior performance) and a secondary antenna (e.g., an antenna whose performance typically does not exceed that of the primary antenna) are sometimes described herein as an example. This is, however, merely illustrative. Device 10 may use three or more antennas if desired. Device 10 may use antennas that are substantially identical (e.g., in band coverage, in efficiency, etc.), or may use other types of antenna configurations.

When operating in single antenna mode, either the primary or the secondary antenna may be used. For example, device 10 may default to use of the primary antenna whenever changing to single antenna mode from dual antenna mode while monitoring paging signals. If desired, device 10 may select an optimum antenna to use when transitioning from dual antenna mode to single antenna mode. Device 10 may select the optimum antenna by evaluating the signal strength on each antenna and choosing the antenna with the strongest signal or by using other suitable antenna selection criteria.

Figure 2:
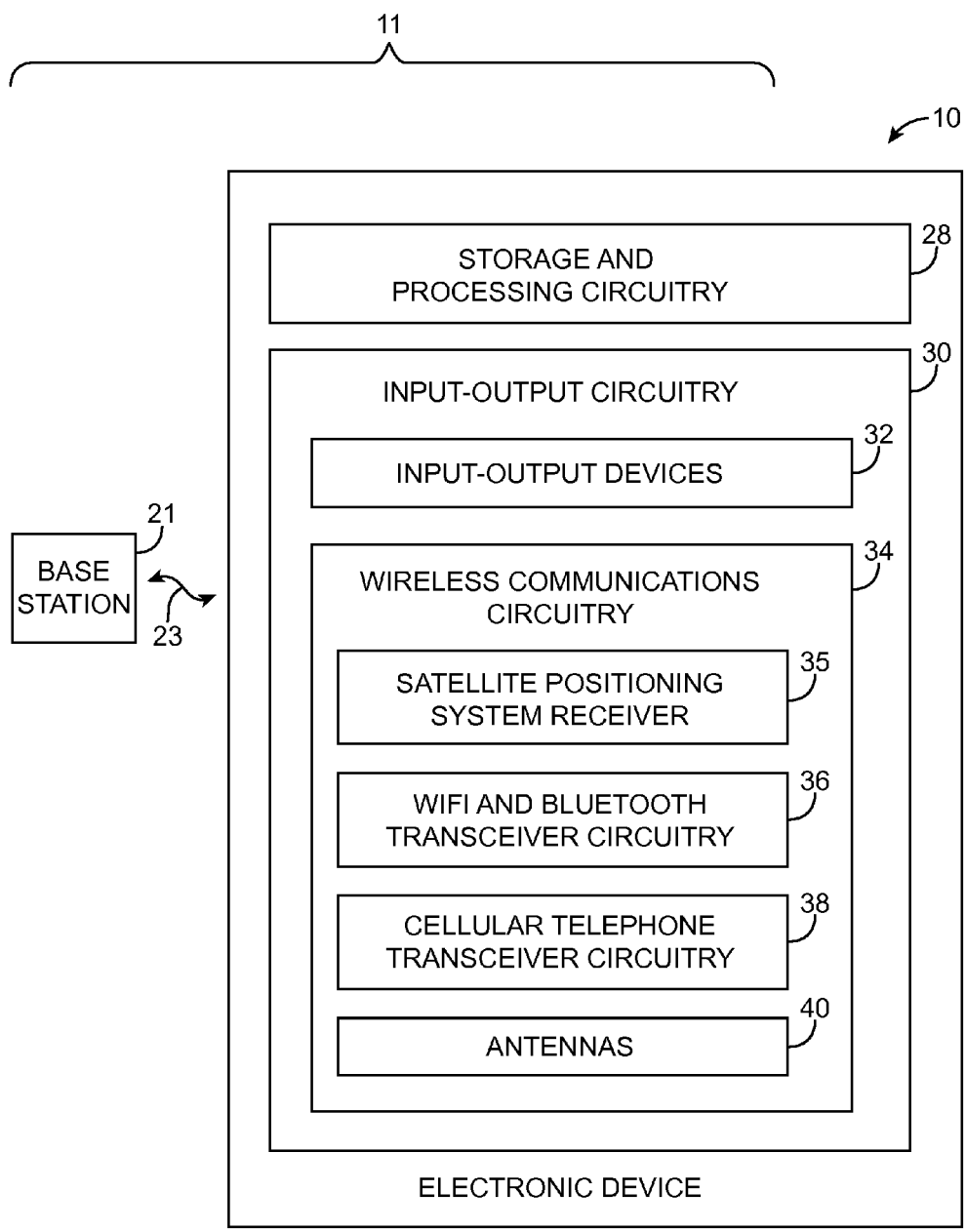
FIG. 2 is a diagram of a wireless network including a base station and an illustrative electronic device having wireless communications circuitry in accordance with an embodiment of the present invention.

A schematic diagram of a system in which electronic device 10 may operate is shown in FIG. 2. As shown in FIG. 2, system 11 may include wireless network equipment such as base station 21. Base stations such as base station 21 may be associated with a cellular telephone network or other wireless networking equipment. Device 10 may communicate with base station 21 over wireless link 23 (e.g., a cellular telephone link or other wireless communications link).

Device 10 may include control circuitry such as storage and processing circuitry 28. Storage and processing circuitry 28 may include storage such as hard disk drive storage, non-volatile memory (e.g., flash memory or other electrically-programmable-read-only memory configured to form a solid state drive), volatile memory (e.g., static or dynamic random-access-memory), etc. Processing circuitry in storage and processing circuitry 28 and other control circuits such as control circuits in wireless communications circuitry 34 may be used to control the operation of device 10. This processing circuitry may be based on one or more microprocessors, microcontrollers, digital signal processors, baseband processors, power management units, audio codec chips, application specific integrated circuits, etc.

Storage and processing circuitry 28 may be used to run software on device 10, such as internet browsing applications, voice-over-internet-protocol (VOIP) telephone call applications, email applications, media playback applications, operating system functions, etc. To support interactions with external equipment such as base station 21, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, IEEE 802.16 (WiMax) protocols, cellular telephone protocols such as the Long Term Evolution (LTE) protocol, Global System for Mobile Communications (GSM) protocol, Code Division Multiple Access (CDMA) protocol, and Universal Mobile Telecommunications System (UMTS) protocol, etc.

Circuitry 28 may be configured to implement control algorithms that control the use of antennas in device 10. For example, circuitry 28 may configure wireless circuitry 34 to switch a particular antenna into use for transmitting and/or receiving signals or may switch multiple antennas into use simultaneously. In some scenarios, circuitry 28 may be used in gathering sensor signals and signals that reflect the quality of received signals (e.g., received paging signals, received voice call traffic, received control channel signals, received data traffic, etc.). Examples of signal quality measurements that may be made in device 10 include bit error rate measurements, signal-to-noise ratio measurements, measurements on the amount of power associated with incoming wireless signals, channel quality measurements based on received signal strength indicator (RSSI) information (RSSI measurements), channel quality measurements based on received signal code power (RSCP) information (RSCP measurements), channel quality measurements based on signal-to-interference ratio (SINR) and signal-to-noise ratio (SNR) information (SINR and SNR measurements), channel quality measurements based on signal quality data such as Ec/Io or Ec/No data (Ec/Io and Ec/No measurements), etc. This information may be used in controlling which antenna mode is used (e.g., single antenna mode or dual antenna mode) and may be used in selecting an optimum antenna in single antenna mode (if desired). Antenna selections can also be made based on other criteria.

Input-output circuitry 30 may be used to allow data to be supplied to device 10 and to allow data to be provided from device 10 to external devices. Input-output circuitry 30 may include input-output devices 32. Input-output devices 32 may include touch screens, buttons, joysticks, click wheels, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 32 and may receive status information and other output from device 10 using the output resources of input-output devices 32.

Wireless communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals.

Wireless communications circuitry 34 may include satellite navigation system receiver circuitry such as Global Positioning System (GPS) receiver circuitry 35 (e.g., for receiving satellite positioning signals at 1575 MHz). Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as bands at 700 MHz, 850 MHz, 900 MHz, 1800 MHz, 1900 MHz, and 2100 MHz or other cellular telephone bands of interest. Wireless communications circuitry 34 can include circuitry for other short-range and long-range wireless links if desired (e.g., WiMax circuitry, etc.). Wireless communications circuitry 34 may, for example, include wireless circuitry for receiving radio and television signals, paging circuits, etc. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable types of antenna. For example, antennas 40 may include antennas with resonating elements that are formed from loop antenna structures, patch antenna structures, inverted-F antenna structures, closed and open slot antenna structures, planar inverted-F antenna structures, helical antenna structures, strip antennas, monopoles, dipoles, hybrids of these designs, etc. Different types of antennas may be used for different bands and combinations of bands. For example, one type of antenna may be used in forming a local wireless link antenna and another type of antenna may be used in forming a remote wireless link antenna. As described in connection with FIG. 1, there may be multiple cellular telephone antennas in device 10. For example, there may be one cellular telephone antenna in region 17 of device 10 and another cellular telephone antenna in region 15 of device 10. These antennas may be fixed or may be tunable.

Figure 3:
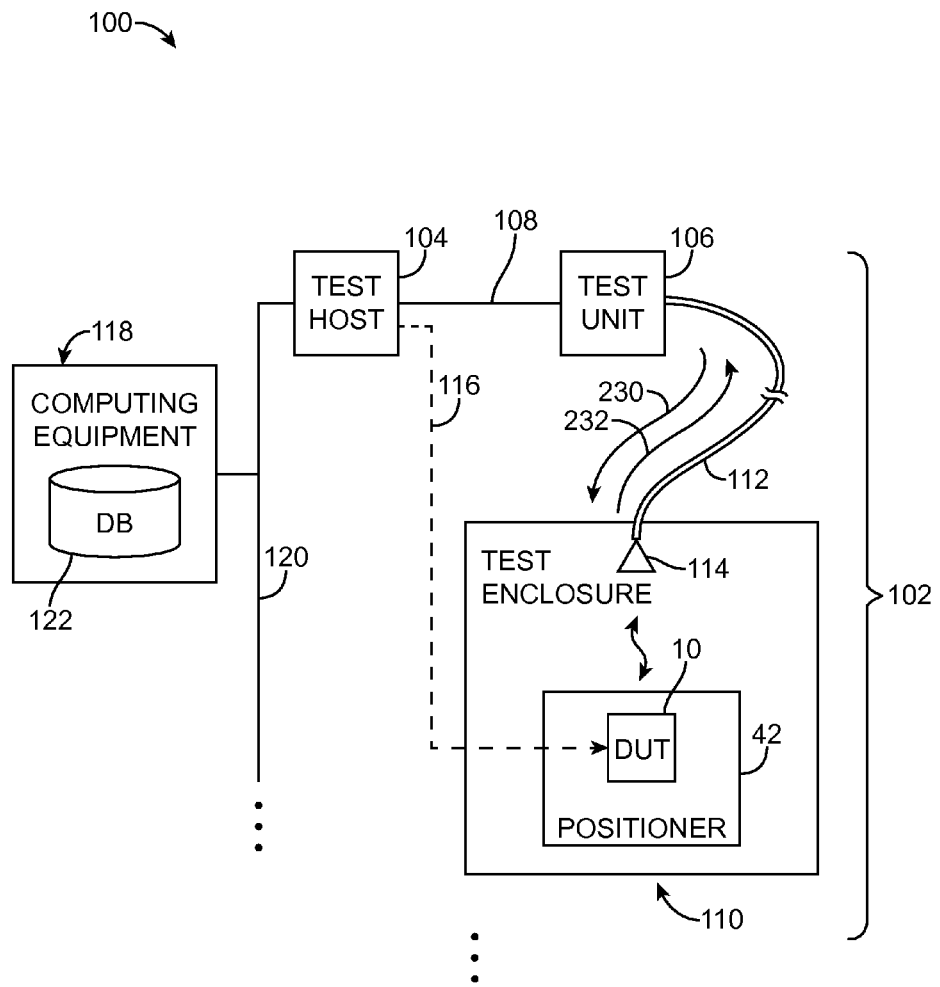
FIG. 3 is a diagram of an illustrative test system that may be used to perform over-the-air testing in accordance with an embodiment of the present invention.

During testing, many wireless devices (e.g., tens, hundreds, thousands, or more of devices 10) may be tested in a test system such as test system 100 of FIG. 3. Electronic devices that are being tested in test system 100 may sometimes be referred to as devices under test (DUTs). Test system 100 may include test accessories, computers, network equipment, tester control boxes, cabling, test enclosures, and other test equipment for generating and receiving radio frequency test signals and gathering test results. Test system 100 may include multiple test stations such as test stations 102. There may, for example, be eighty test stations 102 at a given test site. Test system 100 may include any desired number of test stations to achieve desired test throughput.

Each test station 102 may include a test host such as test host 103, a tester such as test unit 106, and a test enclosure such as test enclosure 110. Test host 104 may, for example, be a personal computer or other type of computing equipment. Test unit 106 may be a signal generator, a spectrum analyzer, a vector network analyzer, and other testers suitable for generating radio-frequency test signals and for performing radio-frequency measurements on signals received from DUT 10. In other suitable arrangements, test unit 106 may be a radio communications tester of the type that is sometimes referred to as a call box or a base station emulator. Test unit 106 may, for example, be the CMU300 Universal Radio Communication Tester available from Rohde & Schwarz. Test unit 106 may be used to emulate the behavior of a base transceiver station during a telephone call with cellular telephone transceiver circuitry 38 to test the ability of transceiver 38 to support "2G" cellular telephone communications protocols such as the 2G GSM and 2G CDMA, 3G Cellular telephone communications protocols such as UMTS and Evolution-Data Optimized (EVDO), 4G cellular telephone communications protocols such as LTE, and other suitable cellular telephone communications protocols. If desired, test unit 106 may be configured to emulate the behavior of a network access point to test the ability of transceiver 36 to support the WiFi® communications protocol, the Bluetooth® communications protocol, or other short-range wireless communications standards.

Test unit 106 may be operated directly or via computer control (e.g., when test unit 106 receives commands from test host 104). When operated directly, a user may control test unit 106 by supplying commands directly to test unit 106 using the user input interface of test unit 106. For example, a user may press one or more buttons in a control panel on the test unit while viewing information that is displayed on a display in test unit 106. In computer-controlled configurations, test host 104 (e.g., software running autonomously or semi-autonomously on the computer) may communicate with test unit 106 by sending and receiving data over a wired path 104 or a wireless path between the computer and the test unit (as an example).

During testing, at least one DUT 10 may be placed within test enclosure 110. DUT 10 may optionally be coupled to test host 104 via control line 116. The connection represented by line 116 may be a Universal Serial Bus (USB) based connection, a Universal Asynchronous Receiver/Transmitter (UART) based connection, or other suitable type of connection. During testing, test host 104 may send control signals to DUT 10 and may retrieve test data from DUT 10 via connection 116. Electrically connecting DUT 10 to test host 104 via connection 116 is, however, optional. If desired, DUT 10 may not be electrically connected to test host 104.

Test enclosure 110 may be a shielded enclosure (e.g., a shielded test box or test cell) that can be used to provide radio-frequency isolation when performing electromagnetic compatibility (EMC) radiated tests without experiencing interference from outside environment. Test enclosure 110 may, for example, be a transverse electromagnetic (TEM) cell. The interior or test enclosure 110 may be lined with radio-frequency absorption material such as rubberized foam configured to minimize reflections of wireless signals.

Test enclosure 110 may include in its interior wireless structures for communicating over short distances using near field electromagnetic coupling (e.g., over ten centimeters or less). Wireless structures in test enclosure 110 may include an inductor or other near field communications element (sometimes referred to as a near field communications test antenna or near field communications coupler) used to radiate corresponding near field electromagnetic signals to DUT 10. A test antenna such as test antenna 114 may be coupled to test unit 106 via a radio-frequency cable such as radio frequency cable 112 (e.g., a coaxial cable). Test antenna 114 may be used during production test procedures to perform over-the-air testing on DUT 10 (e.g., so that radio-frequency test signals may be conveyed between test unit 106 and DUT 10 via antenna 114). Test antenna 114 may, as an example, be a microstrip antenna such as a microstrip patch antenna.

During testing, downlink test signals may be conveyed from test antenna 114 to DUT 10 in the direction of arrow 230, whereas uplink test signals may be conveyed from DUT 10 to test antenna 114 in the direction of arrow 232. Test radio-frequency signals may be conveyed between test unit 106 and DUT 10 over a non-protocol-compliant communications path (e.g., an unauthenticated wireless communications data link) or a protocol-compliant communications link (e.g., an authenticated wireless communications link).

DUT 10 may be loaded with a test system operating system (e.g., a simplified operating system that lacks a full Internet Protocol (IP) stack implementation) or a normal user operating system (e.g., an operating system that includes a full Internet Protocol (IP) stack implementation. DUT 10 may include wireless performance measurement circuitry capable of analyzing the received test signals. As discussed previously, DUT 10 may be capable of computing and storing radio-frequency downlink metrics such as bit error rate measurements, signal-to-noise ratio measurements, measurements on the amount of power associated with incoming wireless signals, channel quality measurements based on received signal strength indicator (RSSI) information, channel quality measurements based on received signal code power (RSCP) information, channel quality measurements based on signal-to-interface ratio (SINR) and signal-to-noise ratio (SNR) information, channel quality measurements based on signal quality data such as Ec/Io or Ec/No data, etc.

As shown in FIG. 3, each test station 102 may be connected to computing equipment 118 through line 120. Computing equipment 118 may include storage equipment on which a database such as database 122 is stored. After desired radio-frequency measurements have been gathered from DUT 10, DUT 10 may be removed from test enclosure 110. Test data may then be loaded onto associated test host 104. The test data gathered at the different test stations 102 may be stored centrally in database 122.

Test system 100 may include a system of automated structures that may be used to facilitate testing of DUTs 10. The system of automated structures may include automated loading equipment, actuating members, positioning equipment, computer-controlled structures, etc. The system of automated structures may increase accuracy and throughput of test system 100.

The system of automated structures may include, for example, automated positioning equipment such as positioner 42. As shown in FIG. 3, each test enclosure 110 may be provided with a positioner 42 that may be used to accurately and precisely position DUT 10 within test enclosure 110. Positioning each DUT 10 in a predetermined location within test enclosure 110 may ensure that test results gathered from different DUTs using that particular test station are comparable. When it is desired to test DUT 10 at test station 102, DUT 10 may be placed on positioner 42 within test enclosure 110. Positioner 42 may include one or more positioning arms that may be used to press DUT 10 against guide surfaces (sometimes referred to as datums) in positioner 42, thereby positioning DUT 10 in a precise location.

The positioning arms on positioner 42 may be actuated by one or more actuating members on positioner 42. The actuating members on positioner 42 may be actuated automatically (e.g., using automated equipment). The actuating members on positioner 42 may, for example, be actuated by an enclosure door associated with enclosure 110. For example, the door to test enclosure 110 may have one or more portions that make contact with the actuating members on positioner 42 when the enclosure door is closed. Closing the enclosure door may therefore actuate the positioning arms on positioner 42 to press DUT 10 against the guide surfaces in positioner 42. This is, however, merely illustrative. If desired, other automated or robotic structures may be used to actuate positioning arms on positioner 42 or to otherwise precisely position DUT 10 within test enclosure 110.

The system of automated structures associated with test system 100 may also include automated loading equipment such as computer-controlled loading arms. Computer-controlled loading arms may be used to convey DUTs between test input locations, test output locations, and test enclosures. The system of automated structures may also include actuating members such as air-driven and motor-driven actuators. For example, an actuating member may be coupled to the door of each test enclosure 110 and may be used to control the opening and closing of the enclosure door.

The system of automated structures in test system 100 may be controlled by computing equipment 118, may be controlled by test host 104, or may be controlled by other computer-based control systems. If desired, some automated structures may be controlled by computing equipment 118, while other automated structures may be controlled by test host 104. For example, actuating members associated with each test enclosure 110 may be controlled by test host 104, whereas loading arms responsible for conveying DUTs between test stations may be controlled by computing equipment 118. This is, however, merely illustrative. In general, any suitable arrangement of computer-based control systems may be used to control the system of automated structures associated with test system 100.

Figure 4:
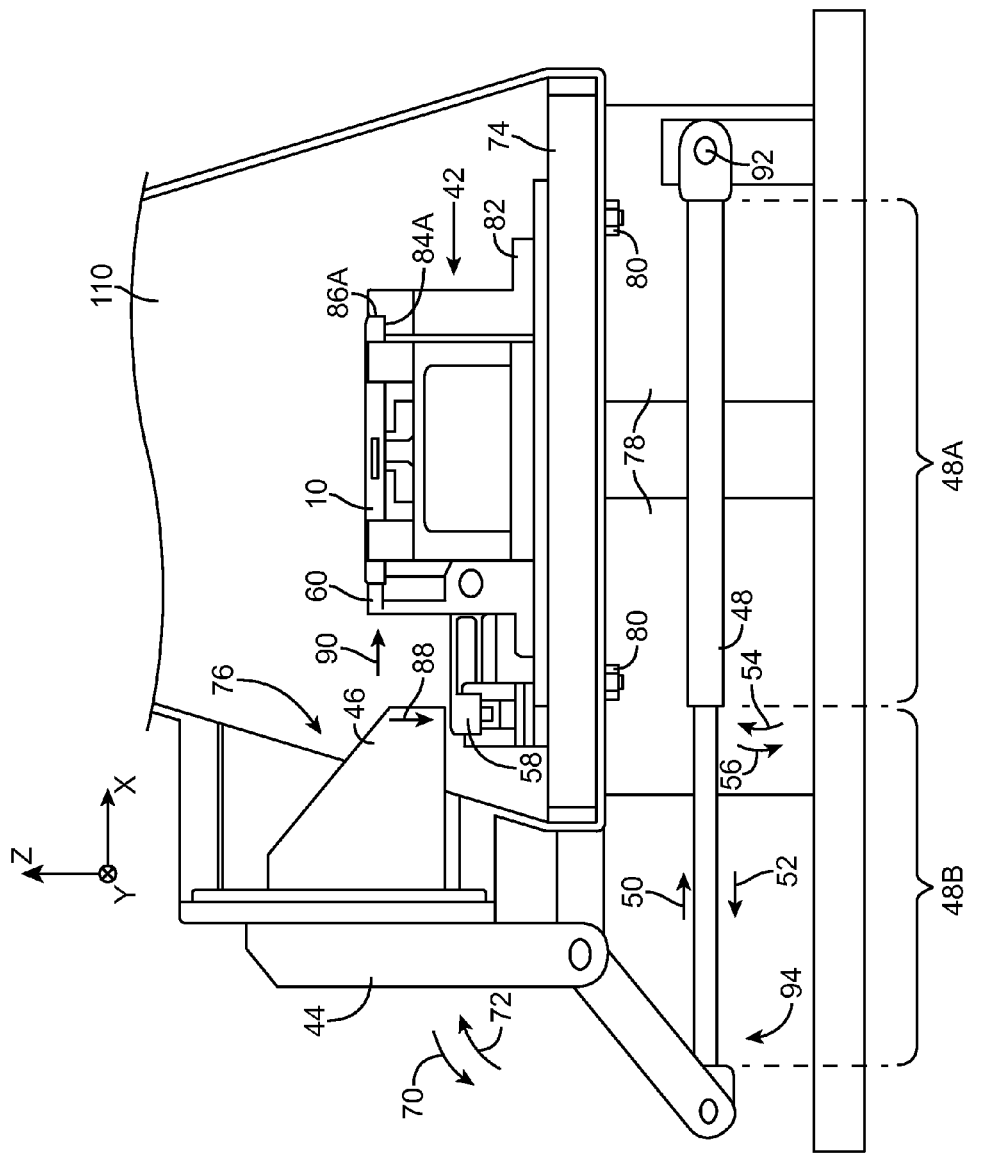
FIG. 4 is a cross-sectional side view of an illustrative test enclosure in which a positioner and device under test have been placed in accordance with an embodiment of the present invention.

FIG. 4 is a cross-sectional side view of an illustrative test enclosure in which a positioner and DUT have been placed. As discussed above in connection with FIG. 3, test enclosure 110 may be a shielded enclosure that may be used to provide radio-frequency isolation when performing electromagnetic compatibility (EMC) radiated tests without experiencing interference from outside environment. Test enclosure may have any suitable shape. In the example of FIG. 4, test enclosure 110 has a pyramid-like shape in which a base portion such as base portion 74 is surrounded by four walls that converge at the top of the enclosure. This is, however, merely illustrative. If desired, test enclosure 110 may have a cylinder-like shape, a cube-like shape, other prism-like shape, etc.

As shown in FIG. 4, test enclosure 110 may include an opening such as opening 76. DUTs may be loaded into and removed from enclosure 110 via opening 76. An enclosure door such as enclosure door 44 may be used to seal opening 76 while tests are being performed on DUT 10 in enclosure 110.

Positioning equipment such as positioner 42 may be mounted on base portion 74 of enclosure 110. Fastening structures such as fastening structures 80 may be used to secure base portion 82 of positioner 42 to base portion 74 of test enclosure 110. Fastening structures 80 may include screws, standoffs, threaded standoffs, and/or other attachment mechanisms that may be used to secure positioner 42 to base 74 of enclosure 110. If desired, fastening structures 80 may have portions that extend into support structures 78 underneath enclosure 110.

Positioner 42 (sometimes referred to as a dielectric support structure) may be configured to receive DUT 10, to precisely position DUT 10 prior to testing, and to support DUT 10 during testing. To support DUT 10 and to accurately place DUT 10 in a precise location along the Z axis, positioner 42 may include one, two, three, or more than three support surfaces such as support surface 84A on which DUT 10 rests. To accurately place DUT 10 in a precise location along the X and Y axes, positioner 42 may include two or more guide surfaces (datums) such as guide surface 86A against which DUT 10 may be pressed. One or more positioning arms such as positioning arm 60 may be use to press DUT 10 against guide surfaces such as guide surface 86A, thereby placing DUT 10 in a precise location (e.g., a precise location along the X, Y, and Z axes).

Positioning arms on positioner 42 such as positioning arm 60 may be controlled by one or more actuating members on positioner 42 such as actuating member 58. By pressing down on actuating member 58 in direction 88, positioning arm 60 may be moved into the position shown in FIG. 4 (e.g., may be moved towards device 10 in direction 90). Enclosure door 44 may have a protruding portion such as portion 46 that may be used to actuate actuating member 58 when enclosure door 44 is in a closed position. Closing enclosure door 44 may therefore actuate positioning arm 60 to press DUT 10 against guide surface 86A.

The opening and closing of enclosure door 44 may be computer-controlled. For example, as shown in FIG. 4, a computer-controlled door actuator such as door actuator 48 may be mechanically coupled to enclosure door 44 and may be used to open and close door 44. Door actuator 48 may, for example, be a pneumatic cylinder having first and second portions 48A and 48B. First portion 48A may be a tube filled with a variable amount of compressed air. Second portion 48B (sometimes referred to as a piston) may be configured to extend out from portion 48A (e.g., in direction 52) and to retract into portion 48A (e.g., in direction 50). As the compressed air in portion 48A expands, piston 48B may be forced outward in direction 52. Piston 48B may be retracted back into air tube 48A using any suitable means (e.g., using force provided by air, using force provided by a spring, etc.).

In addition to expanding and contracting, door actuator 48 may be configured to rotate about pivot point 92 to facilitate opening and closing of enclosure door 44. When it is desired to open door 44, portion 48B may retract into portion 48A of actuator 48 while, at the same time, end portion 94 of actuator 48 moves downward in direction 56. This may in turn move enclosure door 44 outward in direction (e.g., away from opening 76). When it is desired to close door 44, portion 48B may expand outward from portion 48A of actuator 48 while, at the same time, end portion 94 of actuator 48 moves upward in direction 54. This may in turn move enclosure door 44 inward in direction 72 (e.g., towards openings 76). Door actuator 48 may be controlled by a central control system (e.g., by computing equipment 118 of FIG. 3).

If desired, other types of actuators may be used to open and close enclosure door 44 (e.g., motor-driven actuators, other types of air-driven actuators, etc.). The example in which actuator 48 is formed from a pneumatic cylinder is merely illustrative.

Figure 5:
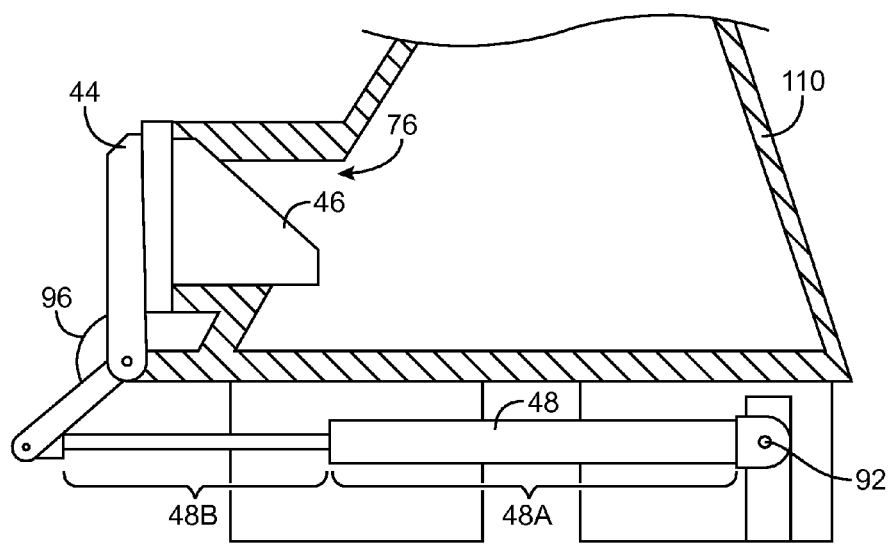
FIG. 5 is a cross-sectional side view of an illustrative test enclosure in which the enclosure door is located in a closed position in accordance with an embodiment of the present invention.
Figure 6:
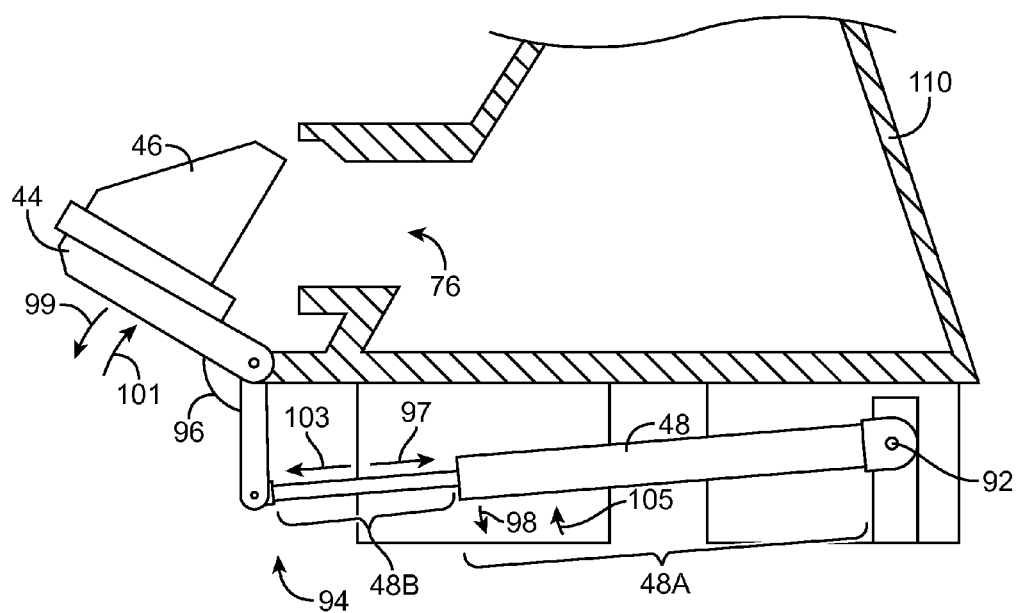
FIG. 6 is a cross-sectional side view of an illustrative test enclosure in which an actuating member has been actuated to move the enclosure door into an open position in accordance with an embodiment of the present invention.

FIGS. 5 and 6 are cross-sectional side views of enclosure 110 showing how enclosure door 44 may be operated. In the example of FIG. 5, enclosure door 44 is in a closed position (e.g., similar to the position shown in FIG. 4). In the closed position, portion 48B of door actuator 48 may be extended out from portion 48A of actuator 48.

When it is desired to open enclosure door 44, portion 48B may begin to retract into portion 48A, as shown in FIG. 6. While portion 48B retracts into portion 48A in direction 97, actuator 48 may simultaneously rotate about pivot point 92 (e.g., in a counterclockwise direction), thereby moving end portion 94 of actuator 48 downwards in direction 98. Angle 96 may remain fixed such that, as end portion 94 of actuator 48 moves in direction 97 and in direction 98, door 44 is moved in direction 99 (e.g., away from enclosure 110).

When it is desired to close enclosure door 44, portion 48B may begin to extend outward from portion 48A. While portion 48B extends outward from portion 48A in direction 103, actuator 48 may simultaneously rotate about pivot point 92 (e.g., in a clockwise direction), thereby moving end portion 94 of actuator 48 upwards in direction 105. Because angle 96 remains fixed, door 44 may be moved in direction 101 (e.g., towards enclosure 110) as end portion 94 of actuator 48 moves in direction 103 and 105.

Figure 7:
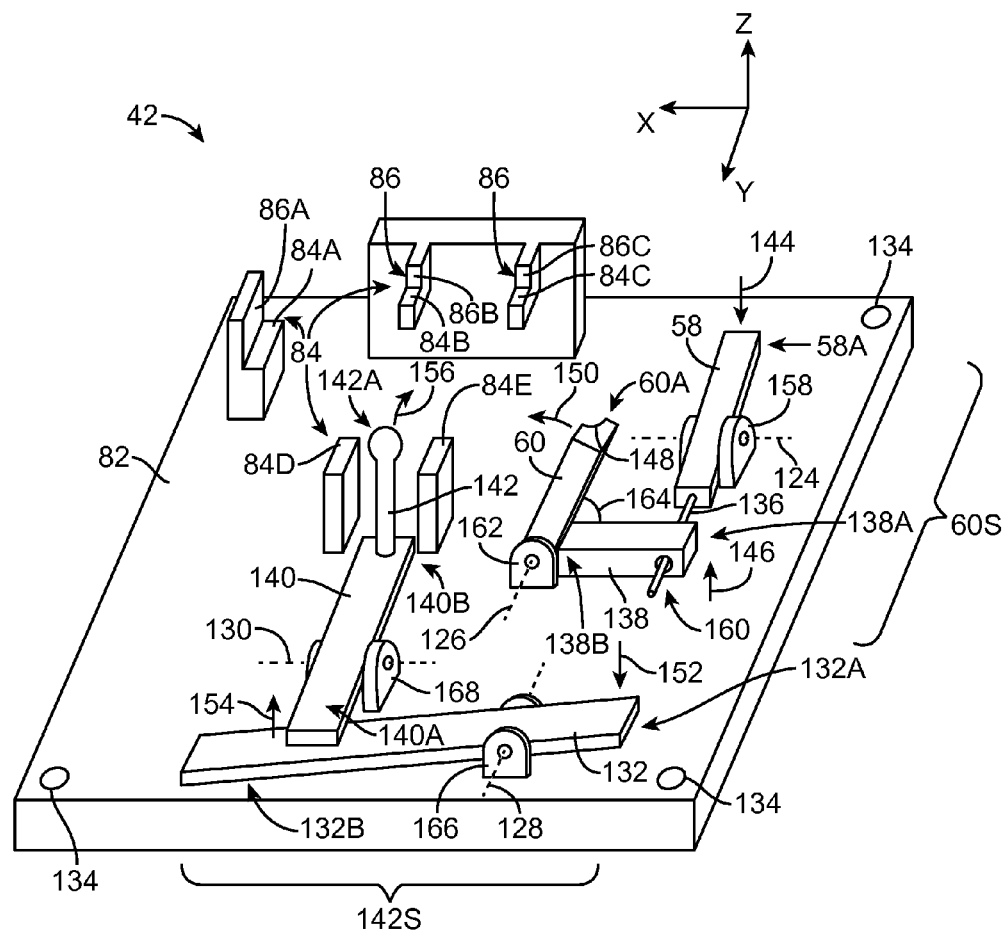
FIG. 7 is a perspective view of an illustrative positioner that may be used to precisely position a device under test in accordance with an embodiment of the present invention.

FIG. 7 is a perspective view of an illustrative positioner that may be used to position a DUT within a test enclosure. As shown in FIG. 7, positioner 42 may include support surfaces such as support surfaces 84. Support surfaces 84 may, for example, be planar surfaces that are parallel to base surface 82 of positioner 42. Support surfaces 84 may be used both to support a DUT as well as to precisely position a DUT in a known location along the Z axis. In the example of FIG. 7, support surfaces 84 include end support surface 84A and side support surfaces 84B, 84C, 84D, and 84E. This is, however, merely illustrative. If desired, there may be one, two, three, four, or more than four support surfaces that may be used to support and position a DUT on positioner 42. The height of support surfaces 84 relative to base 82 of positioner 42 may be known such that a DUT resting on support surfaces 84 has a known location along the Z axis.

In order to precisely position a DUT along the X and Y axes, positioner 42 may include guide surfaces such as guide surfaces 86. Guide surfaces 86 may, for example, be planar surfaces that are perpendicular to support surfaces 84. Guide surfaces 86 may be used as datums (e.g., reference points) against which a DUT is pressed as the DUT rests on support surfaces 84. To position a DUT in a known location along the X axis, the DUT may be pressed against one or more end guide surfaces such as end guide surface 86A. To position a DUT in a known location along the Y axis, the DUT may be pressed against one or more side guide surfaces such as guide surface 86B and/or guide surface 86C. Thus, a DUT resting on support surfaces 84 and in contact with guide surfaces 86 may have a known location along the X, Y, and Z axes (e.g., a known location relative to positioner 42).

The example of FIG. 7 in which there are three guide surfaces (86A, 86B, and 86C) on positioner 42 is merely illustrative. If desired, there may be one, two, three, four, or more than four guide surfaces that may be used to position a DUT on positioner 42.

Positioner 42 may include one or more movable positioning arms such as positioning arms 60 and 142. Positioning arms 60 and 142 may be used to press a DUT (e.g., a DUT resting on support surfaces 84) against guide surfaces 86. For example, positioning arm 60 may be used to press a DUT against guide surface 86A, whereas positioning arm 142 may be used to press a DUT against guide surfaces 86B and 86C.

Positioning arm 60 may be configured to make contact with a corner of a DUT. If, for example, DUT 10 has a shape such as that shown in FIG. 1 (e.g., a rectangular shape having four corners), positioning arm 60 may be used to press against a corner of DUT 10 in direction 150. Positioning arm 60 may, if desired, have a recessed surface such as recessed surface 148 that may be configured to receive a corner portion of DUT 10.

The movement of positioning arms 60 and 142 may be controlled by one or more actuating members. For example, positioning arm 60 may be controlled by an associated set of actuating structures such as actuating structures 60S, whereas positioning arm 142 may be controlled by an associated set of actuating structures such as actuating structures 142S.

Actuating structures 60S may include a first lever such as actuating lever 58 having an extending portion such as portion 136. Actuating lever 58 and associated portion 136 may be mounted on base 82 of positioner 42 using mounting structures 158. Mounting structures 158 may, for example, be located on opposing sides of lever 58 and may be configured to allow lever 58 and associated portion 136 to pivot about axis 124.

Actuating structures 60S may also include a second lever such as intermediary lever 138. As shown in FIG. 7, intermediary lever 138 may be mechanically coupled to extending portion 136 at one end (e.g., end 138A) and may be mechanically coupled to positioning arm 60 at an opposing end (e.g., end 138B). At end 138A, extending portion 136 may pass through an opening in lever 138 such as opening 160. At end 138B, lever 138 and the adjacent portion of positioning arm 60 may be mounted to base 82 using mounting structures 162. Mounting structures 162 may be located on opposing sides of lever 138 and positioning arm 60, and may be configured to allow lever 138 and positioning arm 60 to pivot about axis 126. While lever 138 and positioning arm 60 may both be configured to pivot about axis 126, the angle between lever 138 and positioning arm 60 (e.g., angle 164) may remain fixed.

With this type of configuration, actuating lever 58 may be used to control the movement of positioning arm 60. When it is desired to move positioning arm 60 towards guide surface 86A, end 58A of lever 58 may be pressed down in direction 144. This may in turn move extending portion 136 and attached end 138A of lever 138 upwards in direction 146. Because angle 164 remains fixed, moving end 138A of lever 138 in direction 146 may in turn move end 60A of positioning arm 60 in direction 150 (e.g., towards guide surface 86A).

Actuating structures 142S may include a first lever such as actuating lever 132. Actuating lever 132 may be mounted on base 82 of positioner 42 using mounting structures 166. Mounting structures 166 may, for example, be located on opposing sides of lever 132 and may be configured to allow lever 132 to pivot about axis 128.

Actuating structures 142S may also include a second lever such as intermediary lever 140. As shown in FIG. 7, intermediary lever 140 may be mechanically coupled to lever 132 at one end (e.g., end 140A) and may be mechanically coupled to positioning arm 142 at an opposing end (e.g., end 140B). At end 140A, lever 140 may be attached to end 132B of lever 132. Positioning arm 142 may be mounted on opposing end 140B such that the angle between positioning arm 142 and lever 140 remains fixed. Lever 140 may be mounted to base 82 using mounting structures 168. Mounting structures 168 may, for example be located on opposing sides of lever 140 and may be configured to allow lever 140 to pivot about axis 130.

With this type of configuration, actuating lever 132 may be used to control the movement of positioning arm 142. When it is desired to move positioning arm 142 towards guide surfaces 86B and 86C, end 132A of lever 132 may be pressed down in direction 152. This may in turn move end 132B of lever 132 and attached end 140A of lever 140 upwards in direction 154. Because the angle between positioning arm 142 and lever 140 remains fixed, moving end 140A of lever 140 in direction 154 may in turn move end 142A of positioning arm 142 in direction 156 (e.g., towards guide surfaces 86B and 86C).

Positioner 42 may be mounted in a test enclosure (e.g., test enclosure 110 of FIG. 4). Positioner 42 may be positioned in the test enclosure such that levers 58 and 132 are actuated when the enclosure door is in a closed position. For example, the enclosure door may include one or more protruding portions that, when the door is closed, press down on end 58A of lever 58 (in direction 144) and on end 132A of lever 132 (in direction 152), thereby respectively actuating positioning arms 60 and 142 to move towards guide surfaces 86. Thus, after being placed on support surfaces 84, a DUT may be precisely positioned within a test enclosure by closing the door of the test enclosure.

Positioner 42 may be provided with mounting features such as mounting features 134 that may be used to securely attach positioner 42 to a floor surface of a test enclosure. In the example of FIG. 7, positioner 42 is provided with a mounting feature at each of the four corners of base 82. Mounting features 134 may include one or more holes or openings formed in base 82 and may be configured to align and mate with corresponding fastening structures in a test enclosure (e.g., mounting features 134 may be configured to receive fastening structures 80 of FIG. 4).

Positioner 42 and the associated structures mounted on positioner 42 may be formed from any suitable material. Positioner 42 may, for example, be formed from a plastic having a low dielectric constant and a low dissipation factor. These properties may be desirable for use in testing environments such as antenna testing environments. For example, plastics having a low dielectric constant and a low dissipation factor may be used to reduce or eliminate the probability of unintentionally tuning, altering, or reflecting test signals such as radio-frequency test signals. Positioner 42 may, for example, be formed from an acetal copolymer (e.g., a polyoxymethylene plastic). Acetal copolymer is often characterized by its high strength, stiffness, and low coefficient of friction. These properties may allow positioner 42 to provide sufficient support for an electronic device without imparting unnecessary wear and tear on the electronic device.

If desired, different materials may be used for different structures on positioner 42. For example, positioning arm 142 and extending portion 136 of lever 58 may be formed from a different material than the other structures on positioner 42. If desired, positioning arm 142 and extending portion 136 may be formed from material such as polyetheretherketone. Polyetheretherketone (sometimes referred to as "PEEK" plastic) is a thermoplastic that is often characterized by its high strength and stable behavior under a wide range of conditions. This type of material is also characterized by its elasticity and shape memory. Providing positioning arm 60 and extending portion 136 with shape memory may allow these structures to be repeatedly pressed against other surfaces with little or no deformation.

This is, however, merely illustrative. In general, positioner 42 and the associated structures on positioner 42 may be formed using any suitable material or combination of materials. Examples of materials that may be used to form positioner 42 include polytetrafluoroethylene (PTFE), polycarbonate/acrylonitrile butadiene styrene (PC/ABS), polyamide (PA), other plastics (e.g., thermosetting polymers), and/or other suitable materials.

Figure 8:
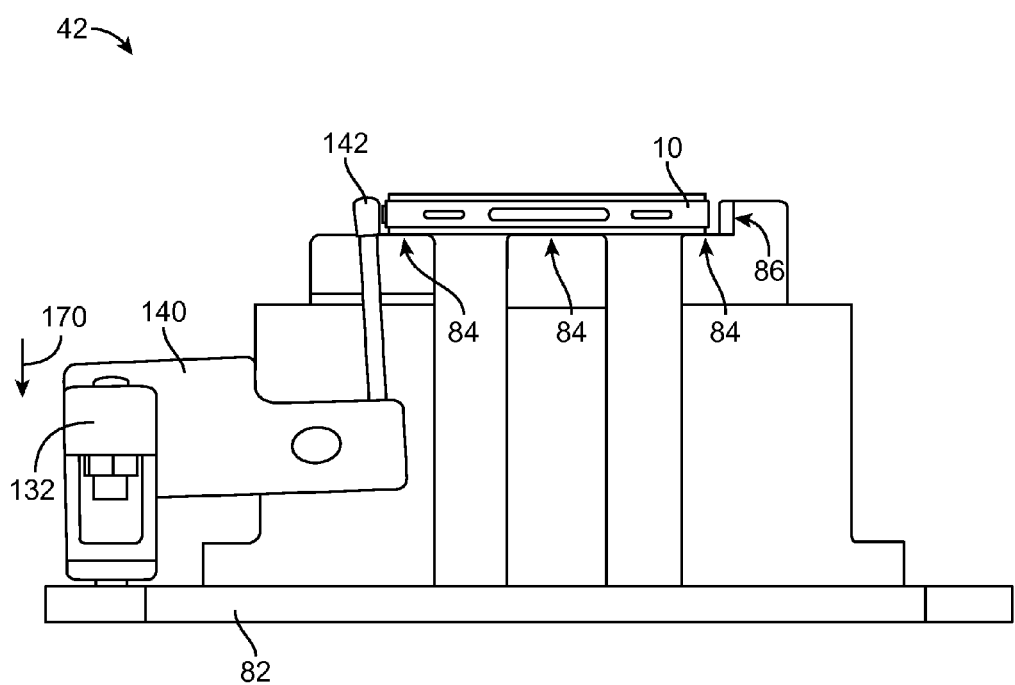
FIG. 8 is a cross-sectional side view of an illustrative positioner in which a device under test has been mounted in accordance with an embodiment of the present invention.

FIG. 8 is a cross-sectional side view of a portion of positioner 42 showing how positioning arm 142 may be used to press DUT 10 against guide surface 86. As shown in FIG. 8, DUT 10 may be placed on support surfaces 84 of positioner 42. By pressing down on actuating lever 132 in direction 170, intermediary lever 140 may in turn move positioning arm 142 towards guide surface 86, thereby pressing DUT 10 against guide surface 86.

Figure 9:
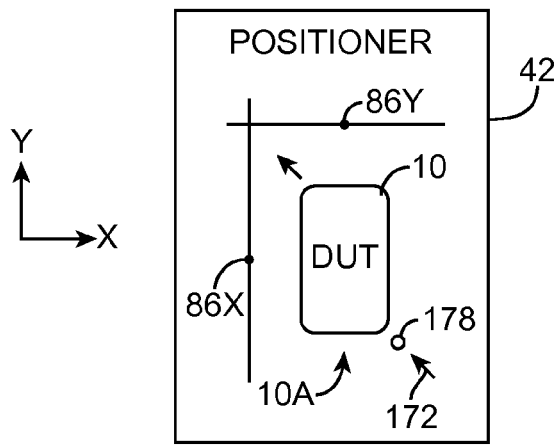
FIG. 9 is a diagram showing how a single positioning arm may be used to press a device under test against two datums in a positioner in accordance with an embodiment of the present invention.
Figure 10:
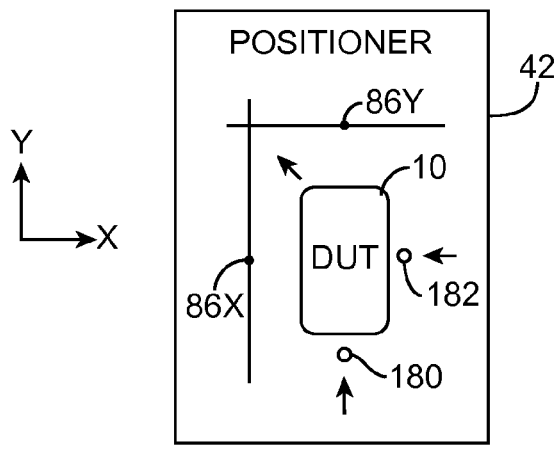
FIG. 10 is a diagram showing how two positioning arms may be used to press a device under test against two datums in a positioner in accordance with an embodiment of the present invention.
Figure 11:
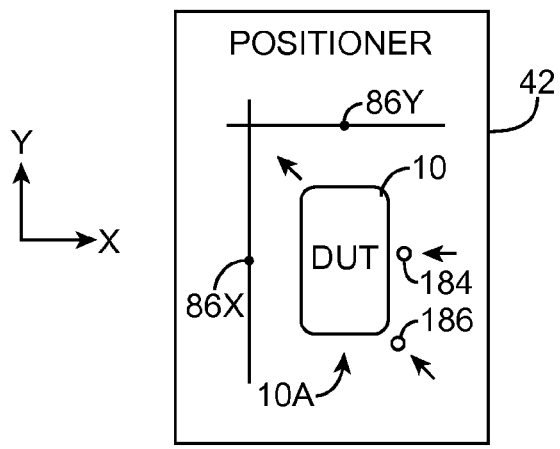
FIG. 11 is a diagram showing how two positioning arms may be used to press a device under test against two datums in a positioner in accordance with an embodiment of the present invention.

The particular configuration of positioner 42 may be customized to accommodate different types of testing environments. For example, the number and location of support surfaces 84 on positioner 42 may be customized, the number and location of guide surfaces 86 on positioner 42 may be customized, etc. Illustrative configurations of positioner 42 that may be used to precisely position a DUT along the X, Y, and Z axes are shown in FIGS. 9-11. In these examples, it is assumed that the location of the DUT along the Z axis is known.

As shown in FIG. 9, positioner 42 may include datums 86X and 86Y. Datum 86X may have a known location along the X axis, whereas datum 86Y may have a known location along the Y axis. A positioning arm such as positioning arm 178 may be used to press DUT 10 against datums 86X and 86Y (e.g., in direction 172). Once DUT 10 is in contact with both datums 86X and 86Y, the precise location of DUT 10 along the X and Y axes may be determined. In the example of FIG. 9, positioning arm 178 is used to press against a corner of DUT 10 in direction 172.

In the example of FIG. 10, positioning arms 180 and 182 are located on two different sides of DUT 10. Positioning arm 182 may be used to press DUT 10 against datum 86X, whereas positioning arm 180 may be used to press DUT 10 against 86Y. Once DUT 10 is in contact with both datums 86X and 86Y, the precise location of DUT 10 along the X and Y axes may be determined.

In the example of FIG. 11, positioning arm 184 may be located on a side of DUT 10 and may be used to press DUT 10 against datum 86X. Positioning arm 186 may be located next to a corner of DUT 10 and may be configured to press DUT 10 against both datums 86X and 86Y. Once DUT 10 is in contact with both datums 86X and 86Y, the precise location of DUT 10 along the X and Y axes may be determined. This type of configuration is similar to that shown in FIG. 7.

In the examples of FIGS. 9 and 11, a positioning arm is located next to a corner of DUT 10, leaving side 10A of DUT 10 unobstructed. With this type of configuration, a computer-controlled loading arm or other structure may easily access DUT 10 via side 10A. Providing access to DUT 10 in this way may allow DUT 10 to be easily placed on and easily removed from positioner 42.

The exemplary configurations of positioner 42 shown in FIGS. 9-11 are merely illustrative. Other suitable configurations of datums and positioning arms may be used to position DUT 10 in a precise location along the X, Y, and Z axes.

Figure 12:
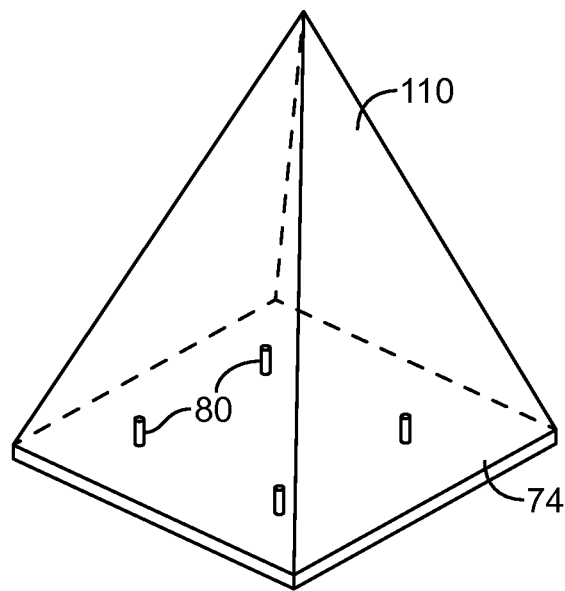
FIG. 12 is a perspective view of an illustrative test enclosure having mounting structures in accordance with an embodiment of the present invention.

FIG. 12 is a perspective view of an illustrative test enclosure 110 showing how a plurality of fastening structures such as fastening structures 80 may be located on floor surface 74 of test enclosure 110. Fastening structures 80 may be used to securely fasten positioner 42 to floor surface 74 of test enclosure 110. Fastening structures 80 may include, for example, threaded standoffs, screws, brackets, other structures, etc.

Figure 13:
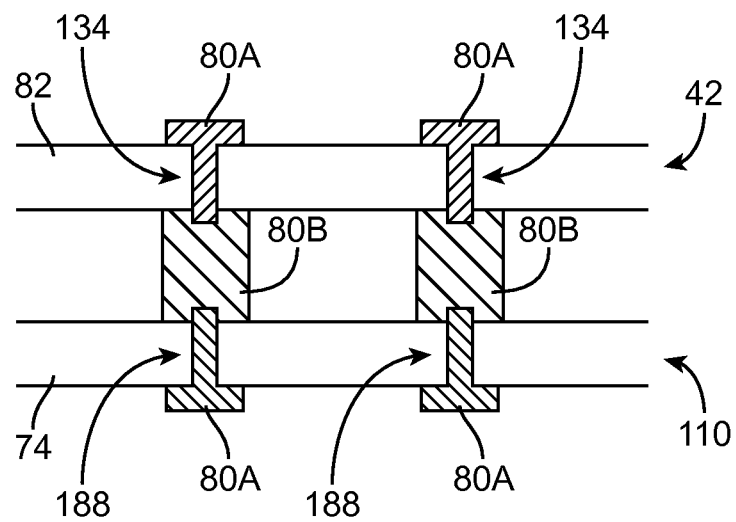
FIG. 13 is a cross-sectional side view showing how a positioner may be mounted on a floor surface of a test enclosure in accordance with an embodiment of the present invention.

An illustrative configuration that may be used to fasten positioner 42 to floor surface 74 of test enclosure 110 is shown in FIG. 13. As shown in FIG. 13, fastening structures 80 may include screws 80A and threaded standoffs 80B. Base 82 of positioner 42 may include corresponding mounting features such as mounting holes 134. Threaded standoffs 80B may be interposed between base 82 of positioner 42 and base 74 of test enclosure 110. A first set of screws 80A may pass through openings 188 in test enclosure base 74 and may be received by threaded standoffs 80A. A second set of screws 80A may pass through mounting holes 134 and may be received by an opposing side of threaded standoffs 80B, thereby securely attaching base 82 of positioner 42 to base 74 of test enclosure 110.

The examples shown in FIGS. 12 and 13 are merely illustrative. If desired, any suitable method may be used to secure positioner 42 to test enclosure floor 74.

Figure 14:
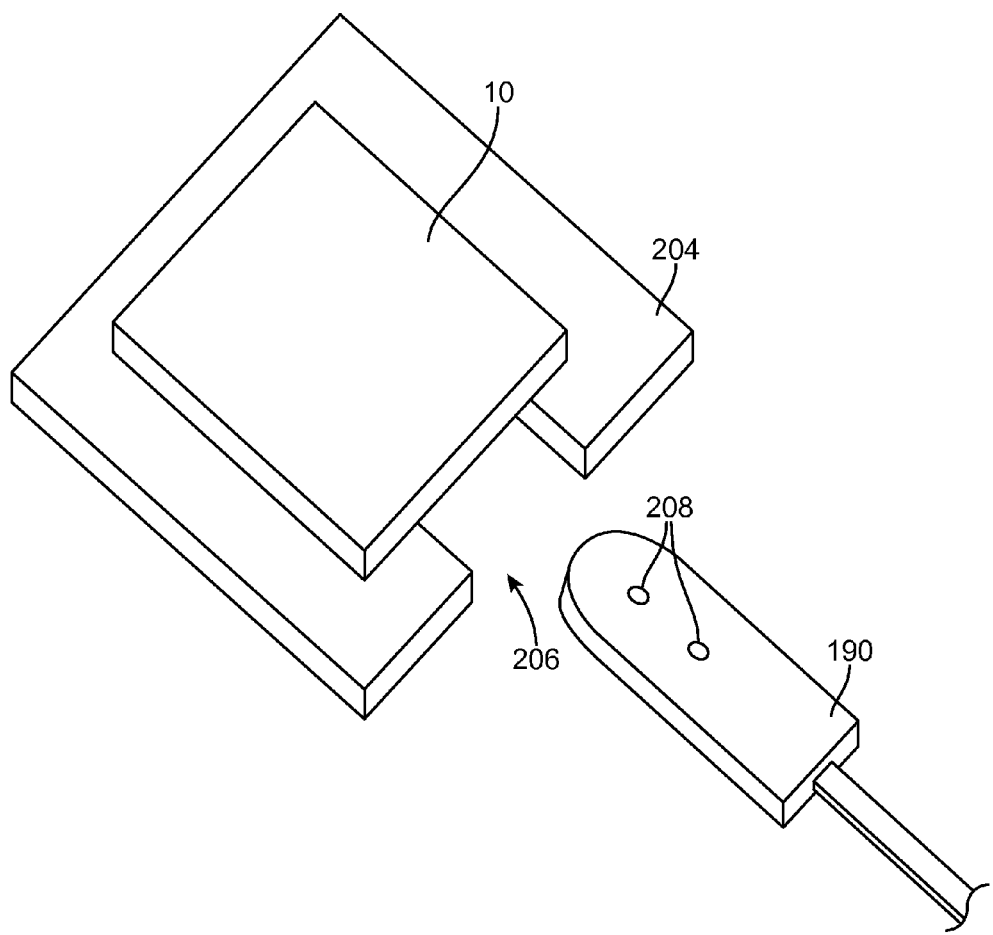
FIG. 14 is a perspective view of an illustrative computer-controlled loading arm that may be used to transfer devices under test to and from test input/output locations in accordance with an embodiment of the present invention.

DUTs 10 may be loaded into and removed from test enclosures 110 using computer-controlled loading equipment. As shown in FIG. 14, the computer-controlled loading equipment may include a computer-controlled loading arm such as loading arm 190. Loading arm 190 may be configured to convey DUTs 10 between test input/output locations such as test input/output location 204. Input/output test location 204 may, for example, be part of a storage cart having shelves on which DUTs 10 are stored before or after being tested at a given test station. Test input/output location 204 may have access features such as slots 206. Slots 206 may allow loading arm 190 to easily pick up DUT 10 from location 204 or to drop off DUT 10 at location 204.

Loading arm 190 may, if desired, be controlled by computing equipment (e.g., computing equipment 118 and/or test host 104 of FIG. 3). When it is desired to test DUT 10 at a given test station, the computing equipment that controls loading arm 190 may direct loading arm 190 to pick up DUT 10 from test input location 204 and to place DUT 10 on positioner 42 within test enclosure 110 (FIG. 4.). When it is desired to remove DUT 10 from test enclosure 110, the computing equipment may direct loading arm 190 to pick up DUT 10 from positioner 42 in test enclosure 110 and to place DUT 10 in an test output location. The test output location may be the same as test input location 204 or may, if desired, be a different location.

Loading arm 190 may be provided with suction features such as pneumatic features 208 that may be used to temporarily adhere DUT 10 to loading arm 190. Pneumatic features 208 (sometimes referred to as pneumatic ports) may be computer-controlled and may be selectively enabled and disabled by the computing equipment. This may allow loading arm 190 to move swiftly between test input/output locations 204 and test enclosures 110 without DUT 10 sliding off loading arm 190.

In the example of FIG. 14, pneumatic features 208 are formed on an upper surface of loading arm 190 so that loading arm 190 can hold DUT 10 from below DUT 10 (i.e., so that DUT 10 rests on top of loading arm 190). This is, however, merely illustrative. If desired, pneumatic features 208 may be formed on a lower surface of loading arm 190 so that loading arm 190 can hold DUT 10 from above DUT 10.

Figure 15:
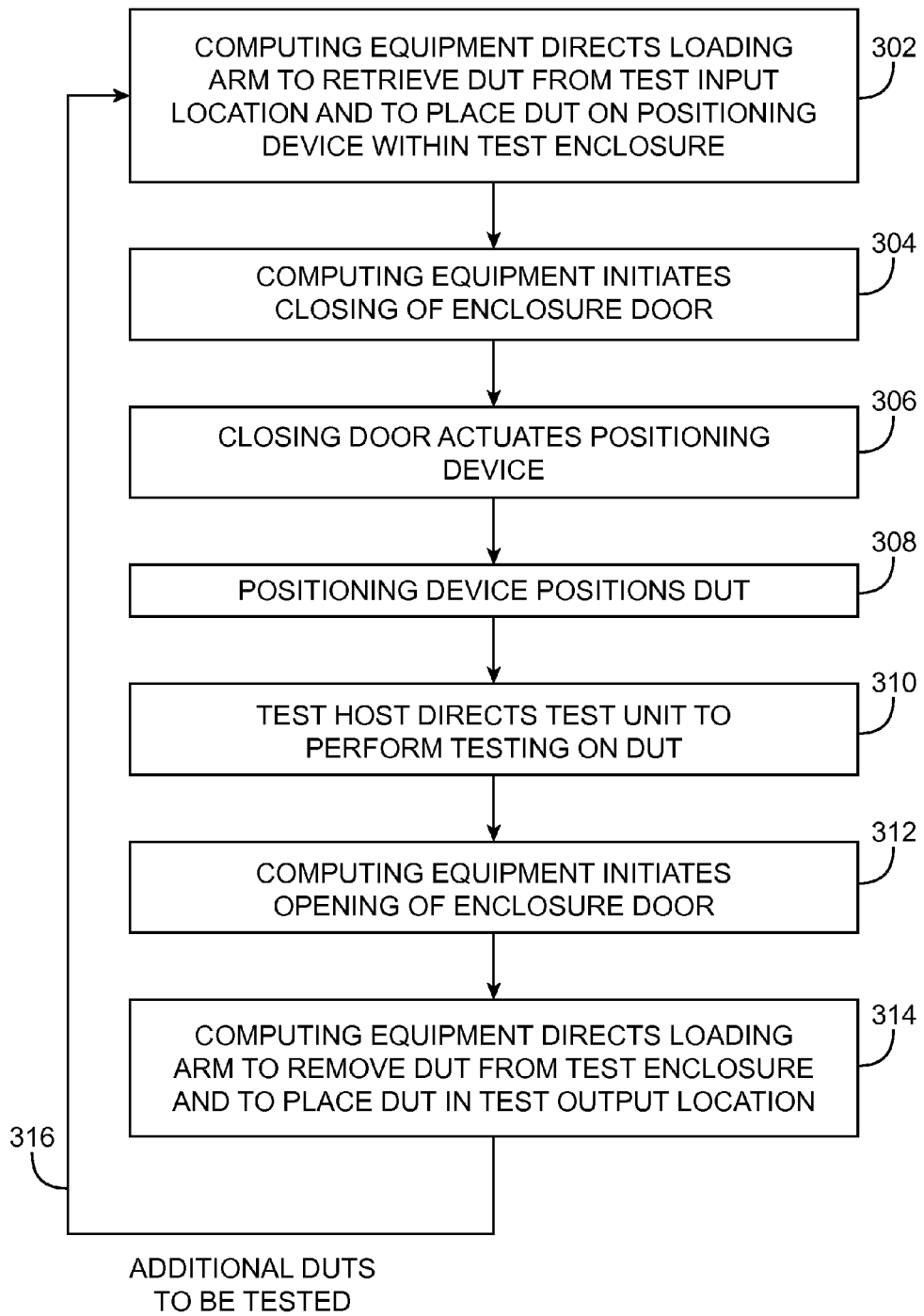
FIG. 15 is a flow chart of illustrative steps involved in testing devices under test using test enclosures, automated loading equipment, and automated positioners in accordance with an embodiment of the present invention.

FIG. 15 is a flow chart of illustrative steps involved in testing DUTs 10 in a test system such as test system 100 of FIG. 3. At step 302, computing equipment (e.g., computing equipment 118, test host 104, or other computing equipment) may direct computer-controlled loading arm 190 to retrieve DUT 10 from a test input location and to place DUT 10 on positioner 42 within test enclosure 110.

At step 304, the computing equipment may initiate closing of the enclosure door (e.g., enclosure door 44 of FIG. 4). The computing equipment may initiate closing of the enclosure door by actuating door actuator 48.

At step 306, one or more protruding portions of the enclosure door may come into contact with one or more actuating members on positioner 42 (e.g., actuating members 58 and 132 of FIG. 7). When the enclosure door is in a closed position, actuating members on positioner 42 may be actuated.

At step 308, each actuating member on positioner 42 may actuate an associated positioning arm on positioner 42 to press DUT 10 against an associated guide surface on positioner 42, thereby positioning DUT 10 in a precise location along three axes (e.g., along orthogonal X, Y, and Z axes). For example, as shown in FIG. 7, actuating member 58 may actuate positioning arm 60 to press DUT 10 against guide surface 86A, whereas actuating member 132 may actuating positioning arm 142 to press DUT 10 against guide surfaces 86B and 86C. As shown in FIGS. 9-11, other configurations of positioning arms may be used to press DUT 10 against one or more datums on positioner 42.

At step 310, test host 104 may direct test unit 106 to perform testing on DUT 10. This may, for example, include over-the-air testing in which radio-frequency test signals are conveyed between test unit 106 and DUT 10 (e.g., via test antenna 114 of FIG. 3).

Following testing of DUT 10 in the test enclosure, the computing equipment may initiate opening of the enclosure door (step 312). The computing equipment may initiate opening of the enclosure door by actuating door actuator 48.

At step 314, the computing equipment may direct computer-controlled loading arm 190 to remove DUT 10 from test enclosure 42 and to transfer DUT 10 to a test output location. Processing may then loop back to step 302 to test additional DUTs 10, as indicated by path 316.

Using automated equipment (e.g., computer-controlled equipment) to perform the steps of FIG. 15 is, however, merely illustrative. If desired, a test system operator may perform the steps of loading DUT 10 into test enclosure 110 and/or closing the enclosure door prior to testing. Positioner 42 may operate to precisely position DUT 10 within the test enclosure regardless of whether or not these steps are automated or if they are performed manually.

The foregoing is merely illustrative of the principles of this invention and various modifications can be made by those skilled in the art without departing from the scope and spirit of the invention.

What is claimed is:

1. Test apparatus for testing a device under test, comprising:
    a test enclosure having an enclosure door; and
    a positioner in the test enclosure that is configured to receive the device under test, wherein the positioner includes at least one positioning arm, an actuating member that controls the positioning arm, and at least two guide surfaces against which the device under test is pressed, the positioner being configured to automatically position the device under test as a result of closing the enclosure door.

2. The test apparatus defined in claim 1, further comprising:
    a computer-controlled door actuator coupled to the enclosure door, wherein the computer-controlled door actuator is configured to control movement of the enclosure door.

3. The test apparatus of claim 2, wherein the computer-controlled door actuator comprises a pneumatic cylinder.

4. The test apparatus of claim 1, further comprising:
    a computer-controlled loading arm configured to place the device under test on the positioner.

5. The test apparatus of claim 4, wherein the computer-controlled loading arm comprises at least one pneumatic port configured to temporarily adhere the device under test to the computer-controlled loading arm.

6. The test apparatus of claim 1, wherein the at least one positioning arm is configured to press the device under test against the at least two guide surfaces.

7. The test apparatus of claim 1, wherein the at least one positioning arm comprises polyetheretherketone.

8. The test apparatus of claim 1, further comprising:
    a test unit coupled to the test enclosure, wherein the test unit is configured to perform testing on the device under test when the device under test is within the test enclosure.

9. A method for testing a device under test in a test system that includes a test enclosure and a test unit coupled to the test enclosure, comprising:
    with a computer-controlled loading arm in the test system, placing the device under test on a positioner within the test enclosure;
    closing the test enclosure;
    in response to closing the test enclosure, automatically positioning the device under test using the positioner, wherein automatically positioning the device under test in response to closing the test enclosure comprises actuating at least one actuating member on the positioner as a result of closing the test enclosure; and
    when the device is properly positioned within the test enclosure, testing the device under test using the test unit.

10. The method defined in claim 9, wherein closing the test enclosure comprises actuating a pneumatic cylinder that is coupled to the test enclosure.

11. The method defined in claim 9, wherein automatically positioning the device under test in response to closing the test enclosure comprises automatically pressing the device under test against at least one guide surface on the positioner using at least one positioning arm on the positioner.

12. The method defined in claim 9, wherein testing the device under test comprises conveying test signals between the test unit and the device under test.

13. The method defined in claim 9, further comprising:
    with the computing equipment, directing the computer-controlled loading arm to remove the device under test from the test enclosure following testing.

14. Test apparatus for testing a device under test, comprising:
    an electromagnetically shielded test enclosure that is configured to be opened and closed;
    a test unit that is coupled to the electromagnetically shielded test enclosure and that is configured to perform testing on the device under test; and
    a dielectric support structure within the electromagnetically shielded test enclosure, the dielectric support structure comprising a positioning arm, an actuating member that controls the positioning arm, and at least two guide surfaces against which the device under test is pressed, wherein the dielectric support structure is configured to receive the device under test and to automatically position the device under test in a predetermined location within the electromagnetically shielded test enclosure as a result of the electromagnetically shielded test enclosure being closed.

15. The test apparatus defined in claim 14, wherein the positioning arm is configured to automatically press the device under test against a first one of the at least two guide surfaces.

16. The test apparatus defined in claim 15, wherein the dielectric support structure further comprises and an additional movable positioning arm, wherein the additional movable positioning arm is configured to automatically press the device under test against a second one of the at least two guide surfaces.

17. The test apparatus defined in claim 14, wherein the actuating member comprises a lever, wherein the electromagnetically shielded test enclosure comprises a test enclosure door operable to be opened and closed, and wherein a portion of the test enclosure door actuates the lever on the dielectric support structure when the enclosure door is closed.

18. The test apparatus defined in claim 17, wherein the positioning arm is configured to press against the device under test when the lever is actuated to position the device under test in the predetermined location.

19. The test apparatus defined in claim 14, wherein the electromagnetically shielded test enclosure comprises a test antenna configured to convey radio-frequency test signals between the test unit and the device under test during testing.

\* \* \* \* \*